US009343509B2

(12) United States Patent
Kim et al.

(10) Patent No.: US 9,343,509 B2
(45) Date of Patent: May 17, 2016

(54) ORGANIC LIGHT-EMITTING DEVICE

(75) Inventors: Myeong-Suk Kim, Yongin (KR); Won-Jun Song, Yongin (KR); Byoung-Ki Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1159 days.

(21) Appl. No.: 13/309,486

(22) Filed: Dec. 1, 2011

(65) Prior Publication Data

US 2012/0298968 A1 Nov. 29, 2012

(30) Foreign Application Priority Data

May 23, 2011 (KR) .......................... 10-2011-0048501

(51) Int. Cl.
*H01L 51/50* (2006.01)
*H01L 27/32* (2006.01)

(52) U.S. Cl.
CPC ........ *H01L 27/3211* (2013.01); *H01L 51/5056* (2013.01); *H01L 51/5088* (2013.01); *H01L 51/506* (2013.01); *H01L 2251/5346* (2013.01)

(58) Field of Classification Search
None
See application file for complete search history.

(56) References Cited

U.S. PATENT DOCUMENTS

| 2004/0119403 | A1 | 6/2004 | McCormick et al. |
| 2006/0105201 | A1 | 5/2006 | Lee et al. |
| 2008/0299365 | A1 | 12/2008 | Choi et al. |
| 2009/0263924 | A1 | 10/2009 | Lee |
| 2011/0062475 | A1* | 3/2011 | Cho ............... H01L 51/5036 257/98 |
| 2011/0240965 | A1* | 10/2011 | Yoon ............. H01L 27/3211 257/40 |

FOREIGN PATENT DOCUMENTS

| CN | 1921140 A | 2/2007 |
| CN | 102208433 A | 10/2011 |
| JP | 2006-140434 A | 6/2006 |
| KR | 10-0669757 B1 | 1/2007 |
| KR | 10-2007-0036994 A | 4/2007 |
| KR | 10-0768230 B1 | 10/2007 |
| KR | 10-0858824 B1 | 9/2008 |
| KR | 10-2009-0131404 A | 12/2009 |

OTHER PUBLICATIONS

Office Action issued Aug. 4, 2015 in corresponding Chinese Application No. 201210100122.9.
Office Action issued Feb. 16, 2016, in corresponding Taiwanese Application No. 100143214.

* cited by examiner

*Primary Examiner* — Gregory Clark
(74) *Attorney, Agent, or Firm* — Knobbe Martens Olson & Bear LLP

(57) ABSTRACT

Provided is an organic light-emitting device including a plurality of pixels, each including a first sub-pixel, a second sub-pixel, and a third sub-pixel having different colors from each other. Each of the pixels includes a substrate, a first electrode layer on the substrate, a first light-emitting layer disposed on the first electrode in the first, second and third sub-pixels, an auxiliary layer disposed on the first light-emitting layer in the second and third sub-pixels, a second light-emitting layer disposed on the auxiliary layer in the second sub-pixel, a third light-emitting layer disposed on the auxiliary layer in the third sub-pixel, and a second electrode layer on the first, second, and third light-emitting layers.

20 Claims, 3 Drawing Sheets

ORGANIC LIGHT-EMITTING DEVICE

CROSS-REFERENCE TO RELATED APPLICATIONS

This application claims the benefit of Korean Patent Application No. 10-2011-0048501, filed on May 23, 2011, in the Korean Intellectual Property Office, the disclosure of which is incorporated herein in its entirety by reference.

BACKGROUND

1. Field

The present disclosure relates to an organic light-emitting device and a method of manufacturing the same, and more particularly, to an organic light-emitting device using a common light-emitting layer, and a method of manufacturing the same.

2. Description of the Related Technology

As a device that uses a material that is self-luminescent under an applied voltage, an organic light-emitting device, when compared to a liquid crystal device, has characteristics of higher brightness, wider viewing angles, and faster response speeds, and can be made slimmer because the organic light-emitting device does not require a backlight.

The organic light-emitting device has a structure in which an organic light-emitting layer is disposed between an anode and a cathode. When a voltage is applied, holes from the anode and electrons from the cathode are injected into the organic light-emitting layer. The injected holes and electrons cause an electron transfer between adjacent molecules in the organic light-emitting layer and move to opposite electrodes. When an electron and a hole are recombined at a certain molecule, a molecular exciton having a high-energy excited state is formed. Light inherent to a material is emitted as the molecular exciton returns to a low-energy ground state.

The organic light-emitting device is composed of a plurality of pixels, each of which includes sub-pixels R, G, and B. Each sub-pixel is patterned using a shadow mask or a fine metal mask. The greater the number of patterned masks, the more complicated the process becomes, the greater the possibility for misalignment, and the higher the cost. Also, limitations due to a shadow phenomenon or a mask bending phenomenon may be present during the patterning using a mask.

SUMMARY

The present embodiments provide an organic light-emitting device, a structure and process of which may be simplified by decreasing the number of masks, and a method of manufacturing the same.

According to an aspect of the present embodiments, there is provided an organic light-emitting device including: a plurality of pixels including a first sub-pixel, a second sub-pixel, and a third sub-pixel having different colors from each other, wherein each of the pixels includes: a substrate; a first electrode layer on the substrate; a first light-emitting layer disposed on the first electrode layer, in the first, second, and third sub-pixels; an auxiliary layer disposed on the first light-emitting layer in the second and third sub-pixels; a second light-emitting layer disposed on the auxiliary layer, in the second sub-pixel; a third light-emitting layer disposed on the auxiliary layer, in the third sub-pixel; and a second electrode layer on the first, second, and third light-emitting layers.

The auxiliary layer may be a co-deposited layer of a hole injection material and a hole transport material. Also, the auxiliary layer may include a first auxiliary layer including the hole injection material and a second auxiliary layer including the hole transport material on the first auxiliary layer. Also, the auxiliary layer may have a concentration gradient in which a concentration of the hole injection material is greater than a concentration of the hole transport material in a lower portion of the auxiliary layer, and in which a concentration of the hole transport material is greater than a concentration of the hole injection material in an upper portion of the auxiliary layer.

Here, the hole injection material may include a phthalocyanine compound, m-MTDATA, TDATA, 2T-NATA, NPB, PEDOT/PSS, Pani/DBSA, Pani/CSA, or PANI/PSS, and the hole transport material may include N-phenylcarbazole, polyvinylcarbazole, TPD, α-NPD, or TCTA.

The auxiliary layer may further include a p-type dopant. The p-type dopant may include tetracyanoquinodimethane (TCNQ), 2,3,5,6-tetrafluoro-tetracyano-1,4-benzoquinodimethane (F4TCNQ), or 1,3,2-dioxaborine.

The first electrode layer may be an anode, and the second electrode layer may be a cathode. The first light-emitting layer may be a blue light-emitting layer, the second light-emitting layer may be a red light-emitting layer, and the third light-emitting layer may be a green light-emitting layer. The organic light-emitting device may further include a hole injection layer between the first electrode layer and the first light-emitting layer and a hole transport layer on the hole injection layer. The organic light-emitting device may further include an electron transport layer and an electron injection layer on the electron transport layer between the second electrode layer and the first, second, and third light-emitting layers.

According to another aspect of the present embodiments, there is provided an organic light-emitting device including: a plurality of pixels including a first sub-pixel, a second sub-pixel, and a third sub-pixel having different colors from each other, wherein each of the pixels includes: a substrate; a first electrode layer on the substrate; a first light-emitting layer disposed on the first electrode layer, in the first, second, and third sub-pixels; an auxiliary layer disposed on the first light-emitting layer, in the first sub pixel and the second sub-pixel; a second light-emitting layer disposed on the auxiliary layer, in the second sub-pixel; a third light-emitting layer on the first light-emitting layer, the auxiliary layer, and the second light-emitting layer; and a second electrode layer on the third light-emitting layer.

The third light-emitting layer may have an electron transport characteristic.

The first light-emitting layer may be a blue light-emitting layer, the second light-emitting layer may be a red light-emitting layer, and the third light-emitting layer may be a green light-emitting layer. Also, the first light-emitting layer may be a blue light-emitting layer, the second light-emitting layer may be a green light-emitting layer, and the third light-emitting layer may be a red light-emitting layer.

The auxiliary layer may include a first auxiliary layer including a hole injection material and a second auxiliary layer including a hole transport material on the first auxiliary layer.

The auxiliary layer may further include a p-type dopant.

The first electrode layer may be an anode, and the second electrode layer may be a cathode. The organic light-emitting device may further include a hole injection layer between the first electrode layer and the first light-emitting layer and a hole transport layer on the hole injection layer. The organic light-emitting device may further include an electron transport layer and an electron injection layer on the electron transport layer between the second electrode layer and the first, second, and third light-emitting layers.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

Figure 1:
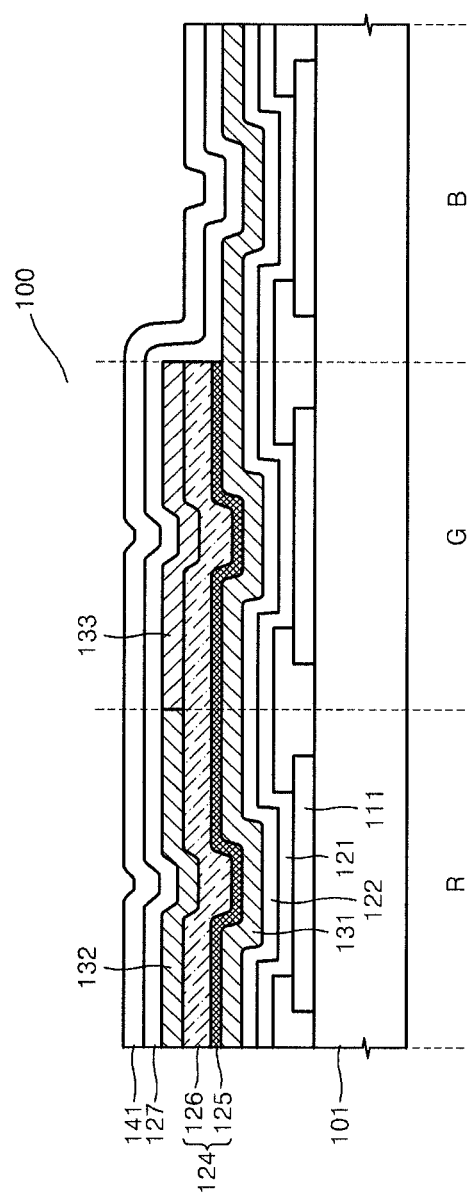
FIG. 1 is a cross-sectional view schematically illustrating an organic light-emitting device according to an embodiment.

The present embodiments will now be described more fully with reference to the accompanying drawings, in which example embodiments are shown. The present embodiments may, however, be in many different forms and should not be construed as being limited to the embodiments set forth herein; rather, these embodiments are provided so that this disclosure will be thorough and complete, and will fully convey the concept of the embodiments to those skilled in the art. In the drawings, the thicknesses of layers and regions are exaggerated for clarity. Like reference numerals in the drawings denote like elements.

FIG. 1 is a cross-sectional view schematically illustrating an organic light-emitting device 100 according to an embodiment. The organic light-emitting device 100 of FIG. 1 includes red, green, and blue sub-pixels R, G, and B.

Referring to FIG. 1, the organic light-emitting device 100 includes an anode 111 on a substrate 101, a hole injection layer 121 on the anode 111, a hole transport layer 122 on the hole injection layer 121, a blue light-emitting layer 131 disposed on the hole transport layer 122 in the red, green, and blue sub-pixels R, G, and B, an auxiliary layer 124 on the blue light-emitting layer 131, a green light-emitting layer 132 and a red light-emitting layer 133 on the auxiliary layer 124, an electron transport layer 127 on the green light-emitting layer 132, the red light-emitting layer 133 and the blue light-emitting layer 131, and a cathode 141 on the electron transport layer 127. Selectively, an electron injection layer (not shown) may be further included between the electron transport layer 127 and the cathode 141.

The blue light-emitting layer 131 is formed common to an entire surface of red, green, and blue sub-pixels R, G, and B. That is, the blue light-emitting layer 131 forms a so-called blue common layer (BCL). The green light-emitting layer 132 and the red light-emitting layer 133 are formed restrictively in green and red sub-pixel regions G and R, respectively.

The auxiliary layer 124 may participate in helping holes that penetrate through the blue light-emitting layer 131 to be effectively transferred to the green light-emitting layer 132 and the red light-emitting layer 133. The auxiliary layer 124 may be composed of a first auxiliary layer 125 and a second auxiliary layer 126. The first auxiliary layer 125 may function as a hole injection layer, and the second auxiliary layer 126 may function as a hole transport layer. The auxiliary layer 124 may also be used to adjust an optical resonance distance for each color sub-pixel. A thickness of a hole injection layer or a hole transport layer is adjusted such that the auxiliary layer 124 may not be formed in a blue sub-pixel region B. At this time, the auxiliary layer 124 may be used with the same thickness in the red sub-pixel region R and the green sub-pixel region G resulting in reducing the number of masks. With respect to emitting green light, a thickness of the auxiliary layer 124 may be adjusted to an optical resonance distance of red emission.

The auxiliary layer 124 may be formed by co-deposition of a hole injection material and a hole transport material, or may be formed to have a concentration gradient between the hole injection material and the hole transport material. When the concentration gradient is formed, a concentration of the hole injection material is greater than a concentration of the hole transport material in a direction near the anode 111 in the auxiliary layer 124 and vice versa in a direction far from the anode 111.

Hereinafter, a material constituting each layer is described.

A substrate used for a typical organic light-emitting device may be used as the substrate 101, and a glass substrate or a transparent plastic substrate, which has good mechanical strength, thermal stability, transparency, surface smoothness, ease of handling, and waterproofness, may be used. The substrate 101 may comprise an opaque material such as silicon and stainless steel. A switching device or a driving device may be formed in the substrate 101.

The anode 111 may comprise a material having a large work function. The anode 111, for example, may comprise a transparent conductive oxide such as indium tin oxide (ITO), indium zinc oxide (IZO), zinc oxide (ZnO), Al-doped zinc oxide (AZO), or indium oxide ($In_2O_3$).

Examples of the hole injection layer 121 may include a phthalocyanine compound such as copper phthalocyanine, 4,4',4"-tris(3-methylphenylphenylamino)triphenylamine (m-MTDATA), 4,4',4"-tris(N,N'-diphenylamino)triphenylamine (TDATA), 4,4',4"-tris{N-(2-naphthyl)-N-phenylamino}-triphenylamine (2T-NATA), N,N'-di(naphthalen-1-yl)-N,N'-diphenylbenzidine (NPB), Poly(3,4-ethylenedioxythiophene)/Poly(4-styrenesulfonate) (PEDOT/PSS), Polyaniline/Dodecylbenzenesulfonic acid (Pani/DBSA), Polyaniline/Camphorsulfonic acid (Pani/CSA), or Polyaniline/Poly(4-styrenesulfonate) (PANI/PSS), but the hole injection layer 121 is not limited thereto. A thickness of the hole injection layer 121 may be in a range of about 100 Å to about 10000 Å, for example, about 100 Å to about 1000 Å. When a thickness of the hole injection layer 121 satisfies the foregoing range, satisfactory hole injection characteristics may be obtained without a substantial decrease in a driving voltage.

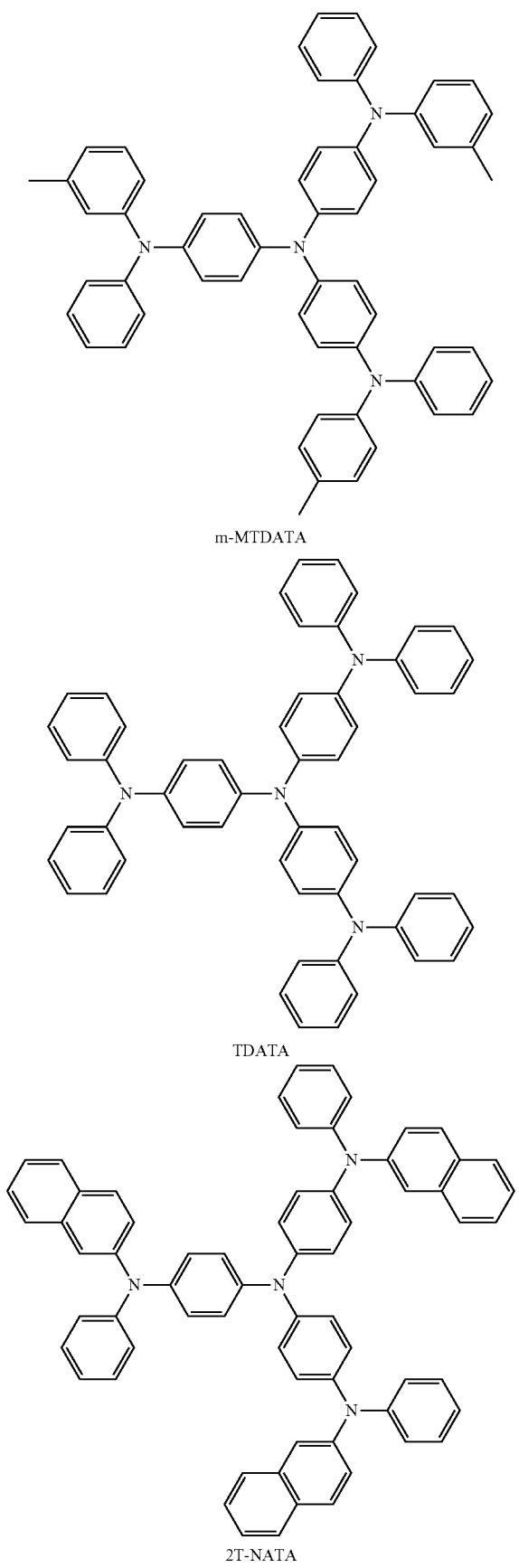

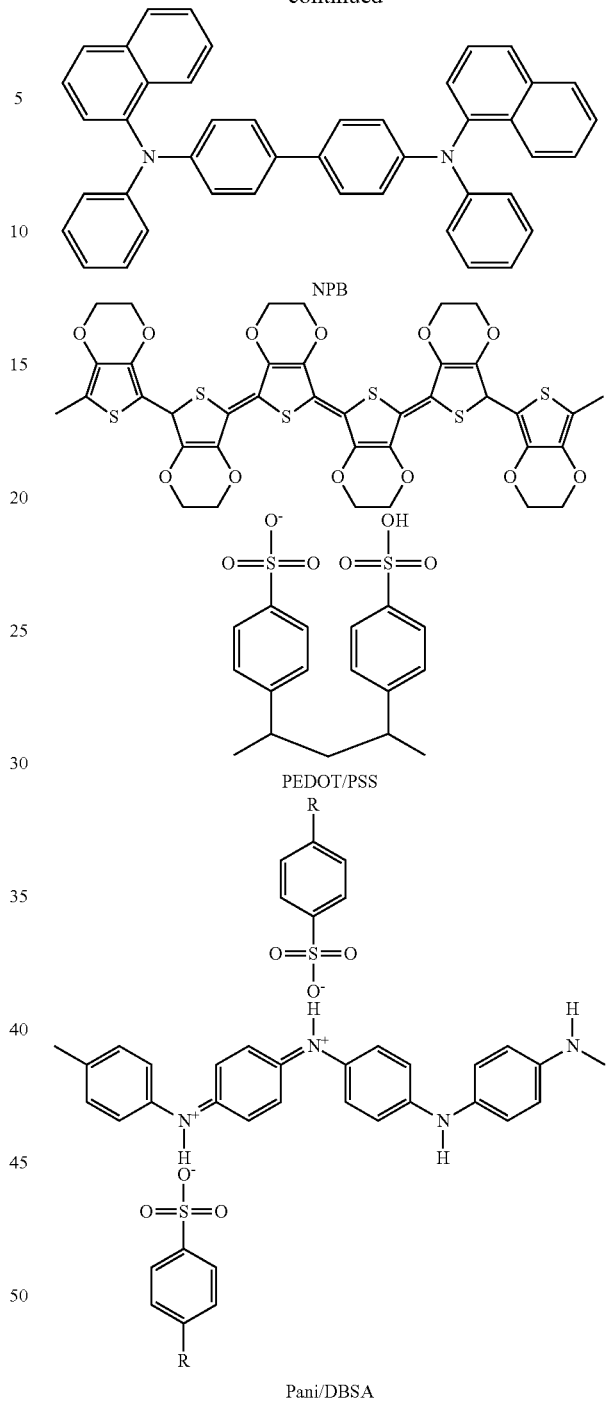

-continued

For example, the hole transport layer 122 may use a publicly known hole transport material including a carbazole derivative such as N-phenylcarbazole, or polyvinylcarbazole, an amine derivative having an aromatic condensed ring such as N,N'-bis(3-methylphenyl)-N,N'-diphenyl-[1,1-biphenyl]-4,4'-diamine (TPD), or 4,4'-bis[N-(1-naphthyl)-N-phenylamino]biphenyl (α-NPD), and a triphenylamine-based material such as 4,4',4"-tris(N-carbazolyl)triphenylamine (TCTA), etc. TCTA among the foregoing materials, for example, may also participate in preventing diffusion of excitons from a light-emitting layer in addition to a role of hole transport.

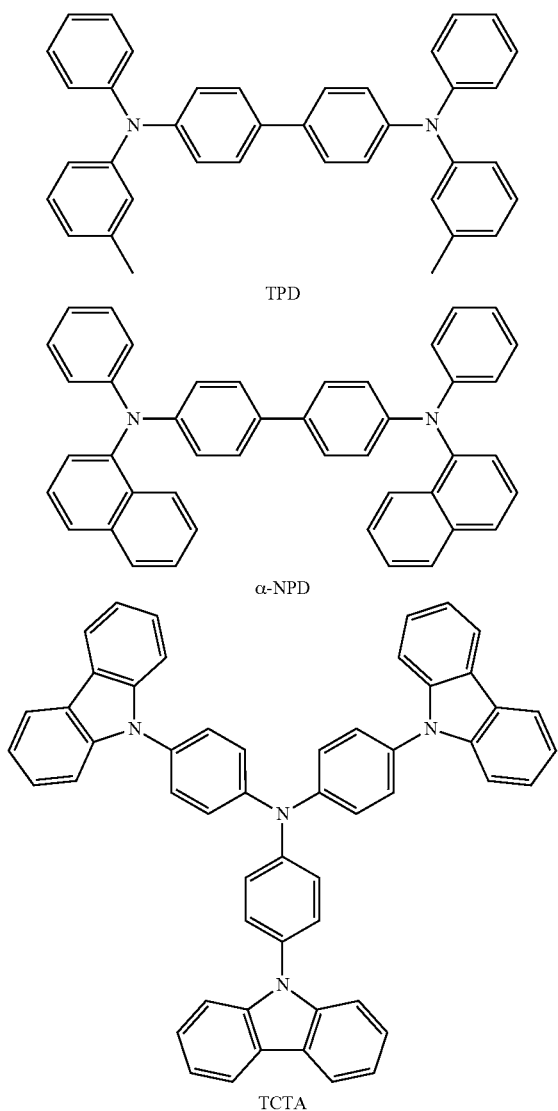

TPD

α-NPD

TCTA

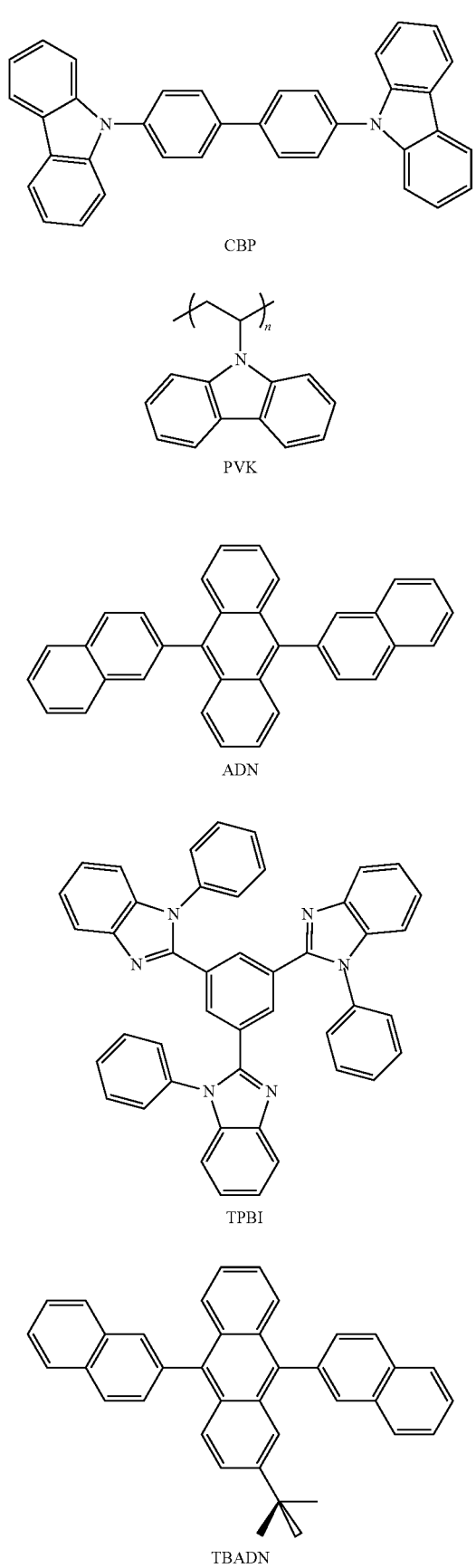

CBP

PVK

ADN

TPBI

TBADN

The hole transport layer and the hole injection layer may be replaced by a functional layer having both a hole transport function and a hole injection function.

A thickness of the hole transport layer 122 may be in a range of about 50 Å to about 1000 Å, for example, about 100 Å to about 800 Å. When a thickness of the hole transport layer 122 satisfies the foregoing range, satisfactory hole transport characteristics may be obtained without a substantial decrease in a driving voltage.

The blue light-emitting layer 131 may include one blue light emitting material or a combination of a blue host and a blue dopant. When the combination of a blue host and a blue dopant is used, examples of a known blue host may be $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyrylarylene (DSA), but the blue light-emitting layer 131 is not limited thereto.

A material having hole transport characteristics may selectively be used as a blue host. For example, a material such as ADN may be used as the blue host having hole transport characteristics.

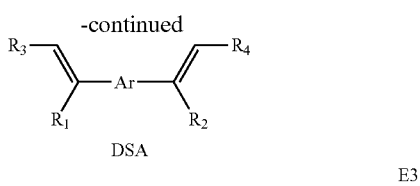

DSA

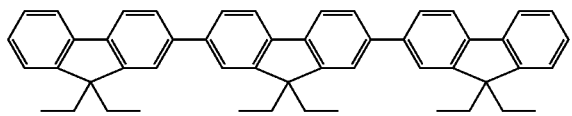

E3

As a publicly known blue dopant, F₂Irpic, (F₂ ppy)₂Ir (tmd), Ir(dfppz)₃, terfluorene, 4,4'-bis(4-diphenylaminostyryl)biphenyl (DPVABi), or 2,5,8,11-tetra-t-butylperylene (TBPe) may be used, but the blue dopant is not limited thereto.

The second auxiliary layer 126 may comprise a material for a hole transport layer, for example, a carbazole derivative such as N-phenylcarbazole or polyvinylcarbazole, an amine derivative having an aromatic condensed ring such as TPD or α-NPD, and a triphenylamine-based material such as TCTA, etc.

The first auxiliary layer 125 or the second auxiliary layer 126 may further include a p-type dopant material. Examples of the p-type dopant may be tetracyanoquinodimethane (TCNQ), 2,3,5,6-tetrafluoro-tetracyano-1,4-benzoquinodimethane (F4TCNQ), or 1,3,2-dioxaborine.

Selectively, the auxiliary layer 124 may comprise a mixture of a hole injection material and a hole transport material. Alternatively, the hole injection material and the hole transport material may also form a concentration gradient in the auxiliary layer 124. For example, a concentration of the hole injection material of the auxiliary layer 124 is higher in a direction near the blue light-emitting layer 131, and a con-

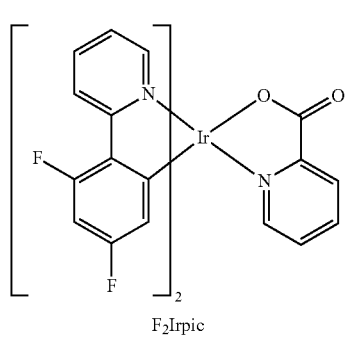

F₂Irpic

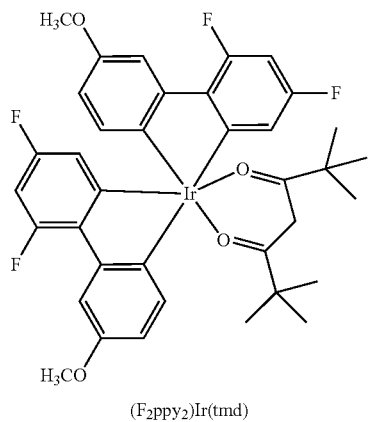

(F₂ppy₂)Ir(tmd)

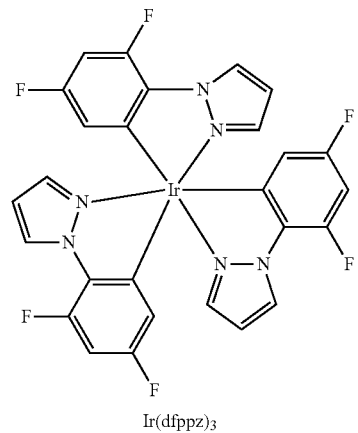

Ir(dfppz)₃

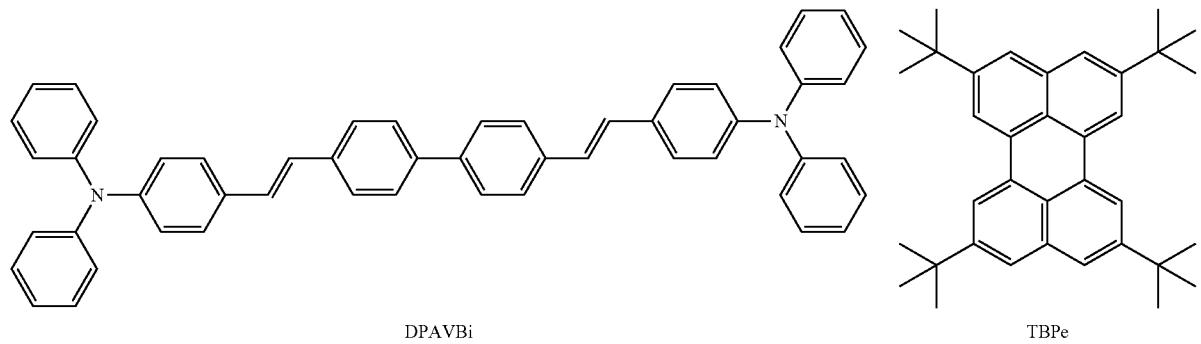

DPAVBi                                                TBPe

The auxiliary layer 124 may have a thickness in a range of about 100-1000 Å.

The auxiliary layer 124 may be composed of two layers, namely, the first auxiliary layer 125, which is a hole injection layer, and the second auxiliary layer 126, which is a hole transport layer.

The first auxiliary layer 125 may comprise a material for a hole injection layer, for example, a phthalocyanine compound such as copper phthalocyanine, m-MTDATA, TDATA, 2T-NATA, NPB, PEDOT/PSS, Pani/DBSA, Pani/CSA, or PANI/PSS.

centration of the hole transport material of the auxiliary layer 124 may be higher in a direction near the red and green light-emitting layers 132 and 133.

The red light-emitting layer 132 may include one red light-emitting material or a combination of a red host and a red dopant. When the combination of a red host and a red dopant is used, examples of the red host, like the blue host, may be Alq₃, CBP, PVK, ADN, TCTA, TPBI, TBADN, E3, or DSA. A material having electron transport characteristics may selectively be used as a red host.

As a publicly known red dopant, PtOEP, Ir(piq)₃, or Btp₂Ir (acac) may be used, but the red dopant is not limited thereto.

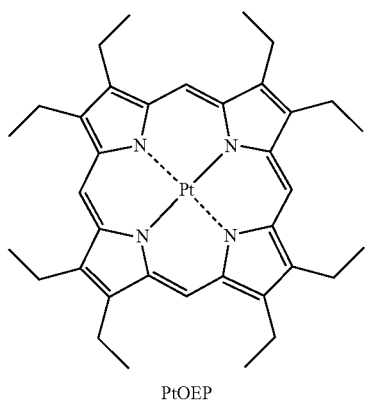

PtOEP

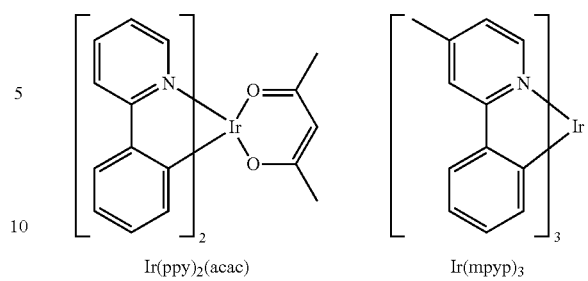

Ir(ppy)₂(acac)　　　Ir(mpyp)₃

When the blue, green, and red light-emitting layers 131, 132 and 133 comprise a combination of a host and a dopant, a content of the dopant may be generally selected in a range of about 0.01 to about 15 parts by weight based on 100 parts by weight of the host. However, the content of the dopant is not limited thereto. Thicknesses of the blue, green, and red light-emitting layers 131, 132 and 133 may be in a range of about 100 Å to about 1000 Å.

A publicly known electron transport material may be used as the electron transport layer 127. Examples of the known electron transport material may be 4,7-diphenyl-1,10-phenanthroline (Bphen), Bis(2-methyl-8-quinolinolate)-4-(phenylphenolato)aluminum (BAlq), tris(8-quinolate)aluminum (Alq₃), beryllium bis(benzoquinolin-10-olate (Bebq2), or 2,2',2"-(1,3,5-Benzinetriyl)-tris(1-phenyl-1-H-benzimidazole (TPBi).

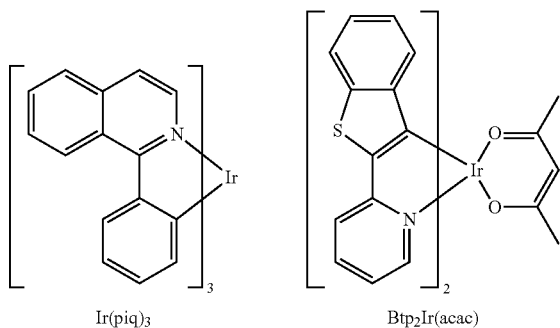

Ir(piq)₃　　　Btp₂Ir(acac)

The green light-emitting layer 132 may include one green light emitting material or a combination of a green host and a green dopant. When the combination of a green host and a green dopant is used, examples of the green host, like the blue host, may be Alq$_a$, CBP, PVK, ADN, TCTA, TPBI, TBADN, E3, or DSA. A material having electron transport characteristics may be selectively used as a green host. When a material having hole transport characteristics is used as the green host of the green light-emitting layer 132 and the red host of the red light-emitting layer 133, the electron transport layer 127 may be omitted.

As a publicly known green dopant, Ir(ppy)₃, Ir(ppy)₂(acac), or Ir(mpyp)₃ may be used, but the green dopant is not limited thereto.

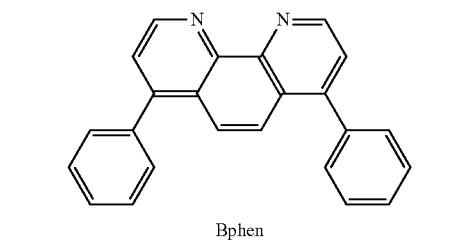

Bphen

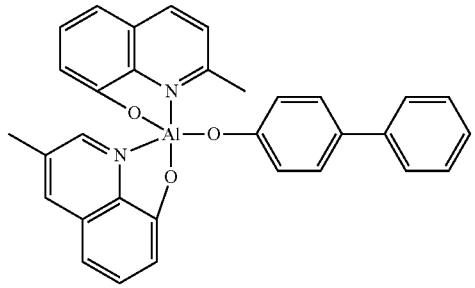

BAlq

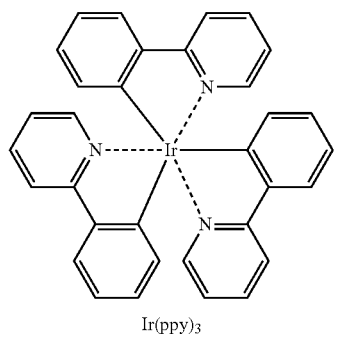

Ir(ppy)₃

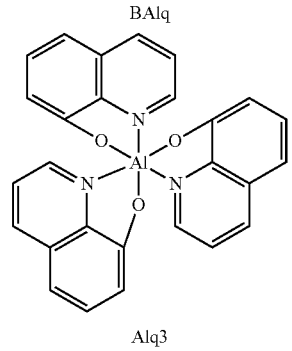

Alq3

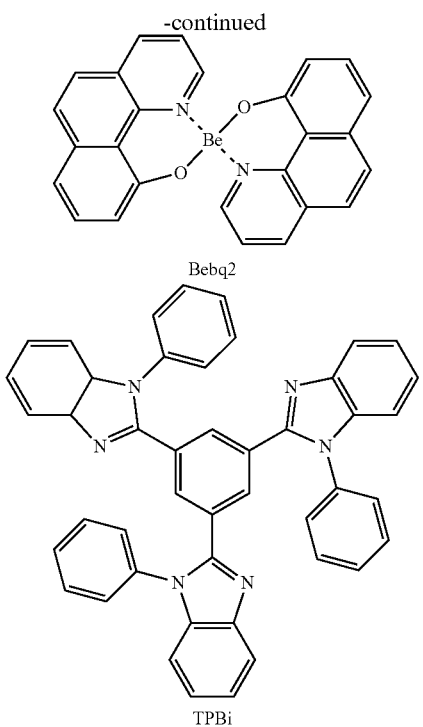

Bebq2

TPBi

The electron transport layer 127 may include a metal-containing material to the electron transporting organic material. For example, the metal-containing material may include a Li-complex.

A thickness of the electron transport layer 127 may be in a range of about 100 Å to about 1000 Å, for example, about 200 Å to about 500 Å. When a thickness of the electron transport layer 127 satisfies the foregoing range, satisfactory electron transport characteristics may be obtained without a substantial increase in a driving voltage.

Optionally, examples of a material constituting the electron injection layer (not shown) may be LiQ, LiF, $Li_2O$, NaCl, NaF, KF, RbF, CsF, FrF, $BeF_2$, $MgF_2$, $CaF_2$, $SrF_2$, BaO, $BaF_2$, or $RaF_2$, but the material constituting the electron injection layer is not limited thereto.

The electron transport layer and the electron injection layer may be replaced by a functional layer having both a electron transport function and a electron injection function.

The cathode 141, for example, may comprise a material including Li, Mg, Al, Ca, Ag, Al:Li, Mg:In, or Mg:Ag, but the material is not limited thereto.

An example of a method of manufacturing an organic light-emitting device in FIG. 1 is described next.

First, an anode 111 is formed on a substrate 101. For example, the anode 111 may be formed by a vacuum deposition method or a sputtering method. A hole injection layer 121 and a hole transport layer 122 are sequentially formed on the anode 111. A blue light-emitting layer 131 is formed on the hole transport layer 122. The anode 111, the hole injection layer 121, the hole transport layer 122, and the blue light-emitting layer 131 may be formed common to an entire surface of red, green, and blue sub-pixels R, G, and B. An auxiliary layer 124 is formed on the blue light-emitting layer 131. The auxiliary layer 124 may be formed to the same thickness in red and green sub-pixel regions R and G. At this time, the auxiliary layer 124 may not be formed in a blue sub-pixel region B. A red light-emitting layer 132 and a green light-emitting layer 133 are formed on the auxiliary layer 124.

The red light-emitting layer 132 is formed as one layer in the red sub-pixel region R and the green light-emitting layer 133 is formed as one layer in the green sub-pixel region G. An electron transport layer 127 is formed on the blue light-emitting layer 131, the red light-emitting layer 132 and the green light-emitting layer 133. The organic layers, for example, may be formed by a vacuum deposition method, a spin coating method, an ink-jet method, or a nozzle method. A cathode 141 is formed on the electron transport layer 127. Optionally, an electron injection layer (not shown) is formed on the electron transport layer 127 and a cathode 141 may be formed on the electron injection layer (not shown). For example, the cathode 141 may be formed by a vacuum deposition method.

Figure 2:
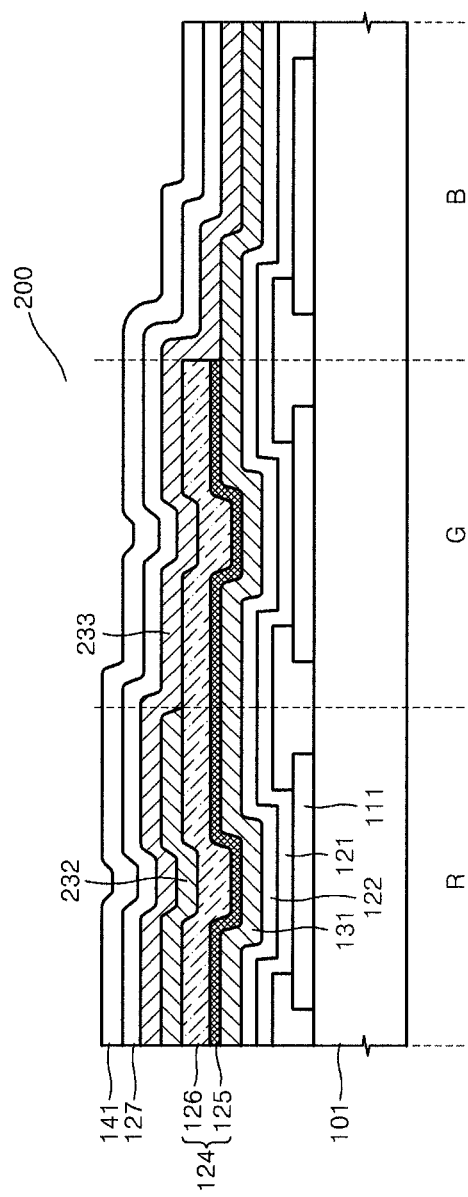
FIG. 2 is a cross-sectional view schematically illustrating an organic light-emitting device according to another embodiment.

FIG. 2 is a cross-sectional view schematically illustrating an organic light-emitting device 200 according to another embodiment. Differences from the organic light-emitting device 100 of FIG. 1 are mainly described.

In the organic light-emitting device 200, a red light-emitting layer 232 is on an auxiliary layer 124, and a green light-emitting layer 233 as a common layer is on the red light-emitting layer 232. The red light-emitting layer 232 is only formed in a red sub-pixel region R, and the green light-emitting layer 233 like the blue light-emitting layer 131 are formed common to an entire surface of red, green, and blue sub-pixels R, G, and B. Thus, the green light-emitting layer 233 forms a green common layer (GCL). Since the green light-emitting layer 233 is common to the entire surface of the sub-pixels, one more mask to form a light-emitting layer is not used so that a structure and a manufacturing process of an organic light-emitting device may be further simplified. Also, a shadow phenomenon, in which a red light-emitting material intrudes into the green sub-pixel region G during deposition of the red light-emitting layer using a mask, may be prevented by forming the red light-emitting layer 232 and the green light-emitting layer 233 at different times.

An example of a method of manufacturing an organic light-emitting device in FIG. 2 is described next. Differences from the method of manufacturing the organic light-emitting device 100 of FIG. 1 are mainly described.

An anode 111, a hole injection layer 121, a hole transport layer 122, a blue light-emitting layer 131, and an auxiliary layer 124 are sequentially formed on a substrate 101 as described in the method of manufacturing the organic light-emitting device 100 of FIG. 1. A red light-emitting layer 232 is formed on the auxiliary layer 124 in a red sub-pixel region R, and a green light-emitting layer 233 is formed common to an entire surface of red, green, and blue sub-pixels R, G, and B on the red light-emitting layer 232, the auxiliary layer 124, and the blue light-emitting layer 131. Thereafter, processes of forming an electron transport layer 127, an electron injection layer (not shown), and a cathode 141 are the same as the method of manufacturing the organic light-emitting device 100 of FIG. 1.

Figure 3:
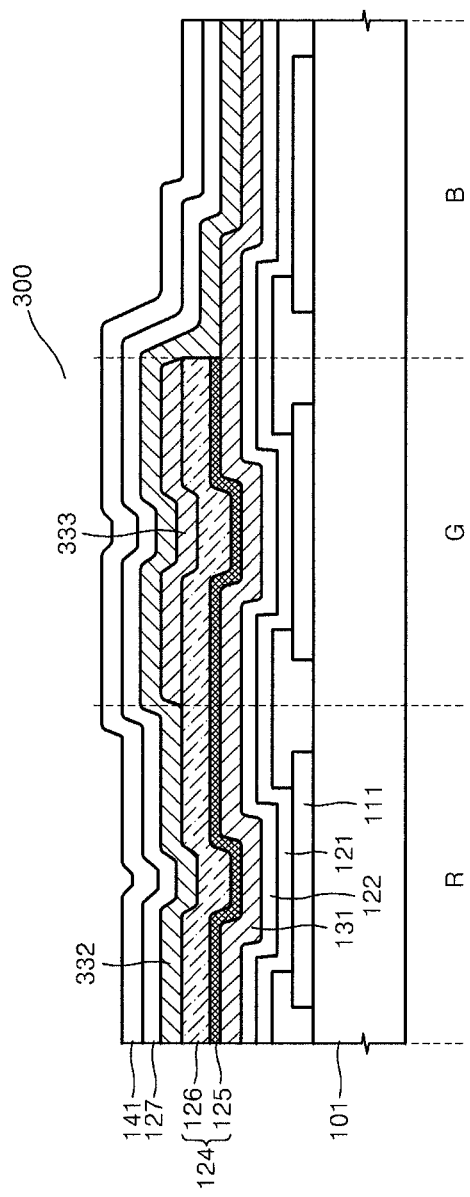
FIG. 3 is a cross-sectional view schematically illustrating an organic light-emitting device according to another embodiment.

FIG. 3 is a cross-sectional view schematically illustrating an organic light-emitting device 300 according to another embodiment. Differences from the organic light-emitting device 100 of FIG. 1 are mainly described.

In the organic light-emitting device 300, a green light-emitting layer 333 is on the auxiliary layer 124, and a red light-emitting layer 332 is on the green light-emitting layer 333. The green light-emitting layer 333 is only formed in a green sub-pixel region G, and the red light-emitting layer 332, like the blue light-emitting layer 131, is formed common to an entire surface of red, green, and blue sub-pixels R, G, and B. Thus, the red light-emitting layer 332 forms a red common layer (RCL). Since the red light-emitting layer 332 is on to the entire surface of the sub-pixels R, G, and B, one more mask is not used so that a structure and a manufacturing process of an organic light-emitting device may be further simplified. Also, a shadow phenomenon, in which a green light-emitting material intrudes into the red sub-pixel region R during deposition of the green light-emitting layer using a mask, may be prevented by forming the red light-emitting layer 332 and the green light-emitting layer 333 at different times.

An example of a method of manufacturing an organic light-emitting device in FIG. 3 is described next. Differences from the method of manufacturing the organic light-emitting device 100 of FIG. 1 are mainly described.

An anode 111, a hole injection layer 121, a hole transport layer 122, a blue light-emitting layer 131, and an auxiliary layer 124 are sequentially formed on a substrate 101 as described in the method of manufacturing the organic light-emitting device of FIG. 1. A green light-emitting layer 333 is formed on the auxiliary layer 124 in a green sub-pixel region, and a red light-emitting layer 332 is formed common to an entire surface of red, green, and blue sub-pixels R, G, and B on the green light-emitting layer 333, the auxiliary layer 124, and the blue light-emitting layer 131. Thereafter, processes of forming an electron transport layer 127, an electron injection layer (not shown), and a cathode 141 are the same as the method of manufacturing the organic light-emitting device 100 of FIG. 1.

Table 1 compares luminous efficiencies of red, green, and blue in the organic light-emitting device 100 (Example) of FIG. 1 and an organic light-emitting device having a typical structure (Comparative Example). The organic light-emitting device having a typical structure has a different structure from the organic light-emitting device 100 (Example) of FIG. 1 in terms of forming red, green, and blue light-emitting layers in corresponding sub-pixel without using a common light-emitting layer and using the auxiliary layer in different thicknesses with respect to each sub-pixel.

TABLE 1

| | Layer Structure | |
|---|---|---|
| | Luminous Efficiency (cd/A) | CIE (x, y) |
| Example (Blue) | ITO(100 nm)/MTDATA(800 Å)/NPB(1000 Å)/ AND: DPVABi(5 wt %)(250 Å)/ Alq$_3$(400 Å)/LiF(50 Å)/Al(1500 Å) | |
| | 3 | 0.15, 0.07 |
| Example (Green) | ITO(100 nm)/MTDATA(800 Å)/NPB(1000 Å)/AND: DPVABi(5 wt %)(250 Å)/NPB: F4TCNQ(1%)(250 Å)/ NPB(850 Å)/AND: Alq$_3$(5 wt %)(250 Å)/ Alq3(400 Å)/LiF(50 Å)/Al(1500 Å) | |
| | 38 | 0.21, 0.73 |
| Example (Red) | ITO(100 nm)/MTDATA(800 Å)/NPB(1000 Å)/AND: DPVABi(5 wt %)(250 Å)/NPB: F4TCNQ(1%)(250 Å)/ NPB(850 Å)/AND: PtOEP(5 wt %)(300 Å)/Alq$_3$(400 Å)/LiF(50 Å)/Al(1500 Å) | |
| | 30 | 0.66, 0.33 |
| Comparative Example (Blue) | ITO(100 nm)/MTDATA(800 Å)/NPB: F4TCNQ(1%)(250 Å)/NPB(1000 Å)/AND: DPVABi(5 wt %)(250 Å)/ Alq$_3$(400 Å)/LiF(50 Å)/Al(1500 Å) | |
| | 3 | 0.15, 0.07 |
| Comparative Example (Green) | ITO(100 nm)/MTDATA(800 Å)/NPB: F4TCNQ(1%)(250 Å)/NPB(1000 Å)/AND: Alq$_3$(5 wt %)(250 Å)/ Alq$_3$(400 Å)/LiF(50 Å)/Al(1500 Å) | |
| | 38 | 0.19, 0.74 |
| Comparative Example (Red) | ITO(100 nm)/MTDATA(800 Å)/NPB: F4TCNQ(1%)(250 Å)/NPB(1000 Å)/AND: PtOEP(5 wt %)(300 Å)/ Alq$_3$(400 Å)/LiF(50 Å)/Al(1500 Å) | |
| | 29 | 0.68, 0.31 |

As shown in Table 1, luminous efficiencies of the blue and green sub-pixels of the organic light-emitting device 100 in the Example are the same as luminous efficiencies of the blue and green sub-pixels in the Comparative Example, respectively. Luminous efficiency of the red sub-pixel of the organic light-emitting device 100 in the Example is slightly higher than luminous efficiency of the red sub-pixel in the Comparative Example. Therefore, it may be understood that luminous efficiency may be maintained high, as well as simplifying a structure and a process by decreasing the number of masks during the forming of a light-emitting layer and an auxiliary layer according to an embodiment.

In the above embodiments of an organic light-emitting device, a structure in a sequence of anode/hole injection layer/hole transport layer/blue light-emitting layer (red, green, and blue regions)/auxiliary layer/red light-emitting layer (red region) and green light-emitting layer (green region)/electron transport layer/electron injection layer/cathode, or anode/hole injection layer/hole transport layer/blue light-emitting layer (red, green, and blue regions)/auxiliary layer/red light-emitting layer (red region)/green light-emitting layer (red, green, and blue regions)/electron transport layer/electron injection layer/cathode, or anode/hole injection layer/hole transport layer/blue light-emitting layer (red, green, and blue regions)/auxiliary layer/green light-emitting layer (green region)/red light-emitting layer (red, green, and blue regions)/electron transport layer/electron injection layer/cathode is described.

As other embodiments, an organic light-emitting device may have a structure in a sequence of hole transport layer/green light-emitting layer (green region) and red light-emitting layer (red region)/auxiliary layer/blue light-emitting layer/electron transport layer, or hole transport layer/red light-emitting layer/green light-emitting layer/auxiliary layer/blue light-emitting layer (red, green, and blue regions)/ electron transport layer, or hole transport layer/green light-emitting layer (green region)/red light-emitting layer (red region)/auxiliary layer/blue light-emitting layer/electron transport layer. That is, positions of the blue light-emitting layer and the green light-emitting layer or the red light-emitting layer may be changed.

Since the number of masks is decreased by using a first light-emitting layer common to sub-pixels and an auxiliary layer common to a first sub-pixel and a second sub-pixel, a structure and a process of an organic light-emitting device are simplified, and thus, reliability of the light-emitting device may be improved. In addition, the number of masks is further decreased by making a third light-emitting layer common to the sub-pixels and the structure and the process of an organic light-emitting device may be further simplified.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:
1. An organic light-emitting device comprising:
 a plurality of pixels, each pixel comprising a first sub-pixel, a second sub-pixel, and a third sub-pixel having different colors from each other,
 wherein each of the pixels comprises:
  a substrate;
  a first electrode layer on the substrate;
  a first light-emitting layer disposed on the first electrode layer in the first, second, and third sub-pixels and formed as a common layer to an entire surface of the first, second, and third sub-pixels;

an auxiliary layer disposed on the first light-emitting layer in the second and third sub-pixels and not being formed in the first sub-pixel;
a second light-emitting layer disposed on the auxiliary layer in the second sub-pixel;
a third light-emitting layer disposed on the auxiliary layer in the third sub-pixel; and
a second electrode layer disposed on the first, second, and third light-emitting layers.

2. The organic light-emitting device of claim 1, wherein the auxiliary layer comprises a hole injection material and a hole transport material.

3. The organic light-emitting device of claim 1, wherein the auxiliary layer comprises: a first auxiliary layer including a hole injection material; and
a second auxiliary layer on the first auxiliary layer and including a hole transport material.

4. The organic light-emitting device of claim 1, wherein the auxiliary layer has a concentration gradient in which the concentration of a hole injection material is greater than a concentration of a hole transport material in a lower portion of the auxiliary layer, and in which the concentration of a hole transport material is greater than a concentration of a hole injection material in an upper portion of the auxiliary layer.

5. The organic light-emitting device of any one claim of claim 2, wherein the hole injection material comprises a phthalocyanine compound, m-MTDATA, TDATA, 2T-NATA, NPB, PEDOT/PSS, Pani/DBSA, Pani/CSA, or PANI/PSS, and the hole transport material comprises N-phenylcarbazole, polyvinylcarbazole, TPD, α-NPD, or TCTA.

6. The organic light-emitting device of claim 1, wherein the auxiliary layer comprises a p-type dopant.

7. The organic light-emitting device of claim 6, wherein the p-type dopant comprises tetracyanoquinodimethane (TCNQ), 2,3,5,6-tetrafluoro-tetracyano-1,4-benzoquinodimethane (F4TCNQ), or 1,3,2-dioxaborine.

8. The organic light-emitting device of claim 1, wherein the first electrode layer is an anode, and the second electrode layer is a cathode.

9. The organic light-emitting device of claim 1, wherein the first light-emitting layer is a blue light-emitting layer, the second light-emitting layer is a red light-emitting layer, and the third light-emitting layer is a green light-emitting layer.

10. The organic light-emitting device of claim 1, further comprising:
a hole injection layer between the first electrode layer and the first light-emitting layer; and
a hole transport layer on the hole injection layer.

11. The organic light-emitting device of claim 1, further comprising:
an electron transport layer between the second electrode layer and the first, second, and third light-emitting layers; and
an electron injection layer on the electron transport layer.

12. An organic light-emitting device comprising:
a plurality of pixels, each pixel comprising a first sub-pixel, a second sub-pixel, and a third sub-pixel having different colors from each other,
wherein each of the pixels comprises:
a substrate;
a first electrode layer on the substrate;
a first light-emitting layer disposed on the first electrode layer, in the first, second, and third sub-pixels and formed as a common layer to an entire surface of the first, second, and third sub-pixels;
an auxiliary layer disposed on the first light-emitting layer, in the second sub-pixel and the third sub-pixel and not being formed in the first sub-pixel;
a second light-emitting layer disposed on the auxiliary layer, in the second sub-pixel;
a third light-emitting layer disposed on the first light-emitting layer, the auxiliary layer, and the second light-emitting layer, in the first, second, and third sub-pixels; and
a second electrode layer disposed on the third light-emitting layer.

13. The organic light-emitting device of claim 12, wherein the third light-emitting layer has an electron transport characteristic.

14. The organic light-emitting device of claim 12, wherein the first light-emitting layer is a blue light-emitting layer, the second light-emitting layer is a red light-emitting layer, and the third light-emitting layer is a green light-emitting layer.

15. The organic light-emitting device of claim 12, wherein the first light-emitting layer is a blue light-emitting layer, the second light-emitting layer is a green light-emitting layer, and the third light-emitting layer is a red light-emitting layer.

16. The organic light-emitting device of claim 12, wherein the auxiliary layer comprises:
a first auxiliary layer including a hole injection material; and
a second auxiliary layer on the first auxiliary layer and including a hole transport material.

17. The organic light-emitting device of claim 12, wherein the auxiliary layer comprises a p-type dopant.

18. The organic light-emitting device of claim 12, wherein the first electrode layer is an anode, and the second electrode layer is a cathode.

19. The organic light-emitting device of claim 12, further comprising:
a hole injection layer between the first electrode layer and the first light-emitting layer; and
a hole transport layer on the hole injection layer.

20. The organic light-emitting device of claim 12, further comprising:
an electron transport layer between the second electrode layer and the first, second, and third light-emitting layers; and
an electron injection layer on the electron transport layer.

* * * * *